(12) United States Patent
Gee et al.

(10) Patent No.: US 6,583,350 B1
(45) Date of Patent: Jun. 24, 2003

(54) THERMOPHOTOVOLTAIC ENERGY CONVERSION USING PHOTONIC BANDGAP SELECTIVE EMITTERS

(75) Inventors: James M. Gee, Albuquerque, NM (US); Shawn-Yu Lin, Albuquerque, NM (US); James G. Fleming, Albuquerque, NM (US); James B. Moreno, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/114,820

(22) Filed: Apr. 3, 2002

Related U.S. Application Data

(63) Continuation-in-part of application No. 09/940,962, filed on Aug. 27, 2001.

(51) Int. Cl.$^7$ .................... H01L 31/058; H01L 31/0264
(52) U.S. Cl. ...................... 136/253; 60/641.8; 431/100; 438/57; 257/432; 257/431
(58) Field of Search ................ 136/253; 60/641.8; 431/100; 438/57; 257/432, 431

(56) References Cited

U.S. PATENT DOCUMENTS

| | | | |
|---|---|---|---|
| 5,385,114 A | | 1/1995 | Milstein et al. |
| 5,601,661 A | * | 2/1997 | Milstein et al. ............ 136/253 |
| 5,998,298 A | | 12/1999 | Fleming et al. |
| 6,130,780 A | * | 10/2000 | Joannopoulos et al. ..... 359/584 |
| 6,358,854 B1 | | 3/2002 | Fleming et al. |

OTHER PUBLICATIONS

Sigalas et al, "Metallic Photonic Band–Gap Materials," Physics Review B, vol. 52, No. 16, Oct. 15, 1995, pp. 11744–11751.*

Gee et al, "Selective Emitters Using Photonic Crystals for Thermophotovoltaic Energy Conversion," 29th IEEE Photovoltaic Specialists Conference, New Orleans, LA, May 20–25, 2002, pp. 1–4.*

Coutts, et al., "Thermophotovoltaics," *Scientific American*, Sep. 1998, 90–95.

Coutts, "A Review of Progress in Thermophotovoltaic Generation of Electricity," *Renewable and Sustainable Energy Reviews 3*, 77 (1999).

Joannopoulos, et al., *Photonic Crystals: Molding the Flow of Light* (1995).

Lin, et al., "Enhancement and suppression of thermal emission by a three–dimensional photonic crystal," *Phys. Rev. B62*, R2243 (2000).

Sigalas, et al., "Metallic photonic band–gap materials," *Phys. Rev. B52*, 11744 (1995).

Zenker, et al., "Efficiency and Power Density Potential of Combustion–Driven Thermophotovoltaic Systems Using GaSb Photovoltaic Cells," *IEEE Trans. Elect. Dev. 48*, 367 (2001).

Heinzel, et al., "Microstructured Tungsten Surfaces as Selective Emitters," *Thermophotovoltaic Generation of Electricity: Fourth NREL Conference*, T.J. Coutts, et al., ed., AIP (1999).

(List continued on next page.)

Primary Examiner—Alan Diamond
(74) Attorney, Agent, or Firm—Kevin W. Bieg

(57) ABSTRACT

A method for thermophotovoltaic generation of electricity comprises heating a metallic photonic crystal to provide selective emission of radiation that is matched to the peak spectral response of a photovoltaic cell that converts the radiation to electricity. The use of a refractory metal, such as tungsten, for the photonic crystal enables high temperature operation for high radiant flux and high dielectric contrast for a full 3D photonic bandgap, preferable for efficient thermophotovoltaic energy conversion.

17 Claims, 9 Drawing Sheets

OTHER PUBLICATIONS

Crowley. "Thermal Spray Approach for TPV Emitters," *Thermophotovoltaic Generation of Electricity: Fourth NREL Conference*, T.J. Coutts, et al., ed., AIP (1999).

Lin, et al., "Media For Control of Thermal Emission and Methods of Applications Thereof", patent application No. 09/441,221, filed Nov. 15, 1999.

Gee, et al., "Photonic Crystals for Thermophotovoltaic Energy Conversion," *Proc. 17th European PV Solar Energy Conference and Exhibition*, Munich, Germany, Oct. 22, 2001.

Ordal, et al., "Optical properties of the metals Al, Co, Cu, Au, Fe, Pb, Ni, Pd, Pt, Ag, Ti, and W in the infrared and far infrared," *Appl. Opt. 22*, 1099 (1983).

Ozbay, et al., "Defect structures in metallic photonic crystals," *Appl. Phys. Lett. 69*, 3797 (1996).

Zakhidov, et al., "Three–dimensionally periodic conductive nanostructures: network versus cerment topologies for metallic PBG," *Synthetic Metals 116*, 419 (2001).

* cited by examiner

THERMOPHOTOVOLTAIC ENERGY CONVERSION USING PHOTONIC BANDGAP SELECTIVE EMITTERS

This application is a continuation-in-part of patent application Ser. No. 09/940,962, filed on Aug. 27, 2001 pending.

This invention was made with Government support under contract no. DE-AC04-94AL85000 awarded by the U. S. Department of Energy to Sandia Corporation. The Government has certain rights in the invention.

FIELD OF THE INVENTION

The present invention relates to thermophotovoltaic energy conversion and, more particularly, to a method for thermophotovoltaic energy conversion using photonic bandgap selective emitters based on photonic crystals.

BACKGROUND OF THE INVENTION

Thermophotovoltaic (TPV) energy conversion converts the radiant energy of a high-temperature source ("emitter") directly into electricity using a photovoltaic cell. TPV has a number of attractive features for electricity generation, including fuel versatility (e.g., nuclear, fossil, or solar energy can be used to heat the emitter), quiet operation, low maintenance, low emissions, light weight, high power density, modularity, and cogeneration of heat and power. If TPV efficiencies can be improved, TPV could potentially be used for distributed power, automotive, military, and other applications wherever fuel cells, microturbines, or cogeneration are presently considered. See, e.g., T. J. Coutts and M. C. Fitzgerald, "Thermophotovoltaics," *Scientific American*, pp. 90–95, September 1998; and T. J. Coutts, "A Review of Progress in Thermophotovoltaic Generation of Electricity," *Renewable and Sustainable Energy Reviews* 3, 77 (1999).

A TPV system can be conveniently described as comprising a heat source to heat an emitter (also known as a radiator) to a sufficiently high temperature to cause the emitter to emit in the visible or near-infrared region of the electromagnetic spectrum and an array of photovoltaic cells to collect the emission from the emitter and convert it into electricity. Whilst the concept of TPV energy conversion is not new, interest in TPV has grown due to recent advances in low-bandgap photovoltaic cells. Such low-bandgap photovoltaic cells are desired to work with emitters at manageable temperatures (e.g., up to 1800° K).

The efficiency of current TPV systems could be significantly improved, if the spectrum of the emitter could be controlled to more precisely match the peak spectral response of the photovoltaic cell. In particular, photovoltaic cells have energy conversion efficiencies of over 50% if illuminated with monochromatic light near their electronic bandgap. Spectral control can be achieved by either tailoring the spectrum of the emitted radiation (i.e., so that the source behaves as a "selective emitter") or by using spectral filters to transmit the matched spectrum and return unwanted radiation back to the emitter. Achieving high TPV efficiencies requires very high performance in terms of the spectral selectivity or reflectivity, bandwidth, and the angular distribution with either the selective emitter or the spectral filter.

Photonic crystals comprise materials having a periodic variation in dielectric constant on the order of the wavelength of light. The periodic variation changes the allowed optical modes in the medium, leading to many varied and useful properties. Some photonic crystals can completely eliminate optical modes in all directions for a specific band of wavelengths. These structures are said to exhibit a full three-dimensional (3D) photonic bandgap. The spectral emissivity is zero within a full 3D photonic bandgap. A description of photonic crystals and their properties is given by Joannopoulos et al., in *Photonic Crystals: Molding the Flow of Light* (1995).

The thermal radiation spectrum and, therefore, the emissivity can be altered by suitable modification of the properties of photonic crystals. Therefore, photonic crystals can potentially be used as selective emitters for TPV energy conversion. The use of photonic crystals for the control of emission of thermal radiation from an object is disclosed in copending U.S. patent application Ser. No. 09/441,221 to Lin and Fleming, which is incorporated herein by reference. Modification of the thermal radiation from a photonic structure in the infrared portion of the spectrum has been described by Lin et al. in "Enhancement and suppression of thermal emission by a three-dimensional photonic crystal," *Phys. Rev B*62, R2243 (2000). Lin et al. fabricated a 3D "Lincoln-Log" type silicon photonic crystal with air as the second dielectric. The silicon photonic crystal had a lattice constant of 4.2 $\mu$m and a full photonic bandgap. When heated to 410° C., the silicon photonic crystal exhibited significantly reduced emissivity in the infrared wavelength range between 10 and 16 $\mu$m, indicative of suppressed emission within the photonic bandgap and enhanced emission at energies below the band edge.

Milstein et al., U.S. Pat. No. 5,601,661, discloses the use of reticulated photonic bandgap structures, including aluminum oxides, semiconductors, rare-earth oxides, and plastics, as thermophotovoltaic emitter materials. However, it is unlikely that the reticulated structures and low-dielectric-contrast materials disclosed by Milstein et al. actually behave as photonic crystals having full 3D photonic bandgaps. Therefore, the reticulated structure and materials disclosed by Milstein et al. are unlikely to achieve the true emission selectivity at high temperature necessary for efficient TPV energy conversion. In particular, Milstein et al. does not teach metallic photonic crystals having enhanced emission matched to the spectral response of a photovoltaic cell.

Therefore, a need remains for a high-temperature photonic crystal that can selectively emit radiation in a narrow band matched to the spectral response of low-bandgap photovoltaic cells, thereby enabling efficient TPV energy conversion. The present invention provides a method for TPV energy conversion based on selective emission from photonic crystals comprising metals that enable high temperature operation and a full three-dimensional photonic bandgap.

SUMMARY OF THE INVENTION

A method for thermophotovoltaic generation of electricity comprises heating a photonic crystal comprising a metal having a complex dielectric constant and at least one other lattice material having at least one other dielectric constant, whereby the photonic crystal selectively emits radiation at emission wavelengths less than an electronic bandgap wavelength of at least one photovoltaic cell, and collecting the selectively emitted radiation with the at least one photovoltaic cell, whereby the at least one photovoltaic cell converts the selectively emitted radiation to electricity. The selectively emitted radiation can be from enhanced emission below the band edge of the photonic bandgap or from defect cavity emission within the photonic bandgap. The metal can be a refractory metal, such as tungsten. The photovoltaic cell can be a low-bandgap photovoltaic cell.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 1 shows the thermophotovoltaic behavior of a selective emitter.

FIG. 4 shows a cross-sectional scanning electron micrograph of a four-layer tungsten photonic crystal built on a (001) oriented silicon substrate.

DETAILED DESCRIPTION OF THE INVENTION

TPV system conversion efficiency is the product of the fuel-to-radiation conversion efficiency and the radiation-to-electricity conversion efficiency. For the purpose of this disclosure, only the radiation-to-electricity conversion efficiency, hereinafter referred to as the TPV efficiency, will be considered. Therefore, the TPV efficiency as used herein does not include combustion processes, heat transfer effects, and other inefficiencies that would be included in calculating the overall TPV system conversion efficiency. Furthermore, an ideal optical system with no radiative or other optical losses is assumed.

The TPV efficiency $\eta_{TPV}$ is given by the photovoltaic cell power output divided by the emitter output $$\eta_{TPV} = \frac{V_{oc} \cdot FF \cdot \int_{300}^{\lambda_g} R(\lambda)\varepsilon(\lambda)M(\lambda)d\lambda}{\int_0^\infty \varepsilon(\lambda)M(\lambda)d\lambda}$$

where $V_{OC}$ is the cell open-circuit voltage, FF is the fill factor, $\lambda_g$ is the electronic bandgap wavelength, and $R(\lambda)$ is the spectral response of the photovoltaic cell.

Figure 1A:
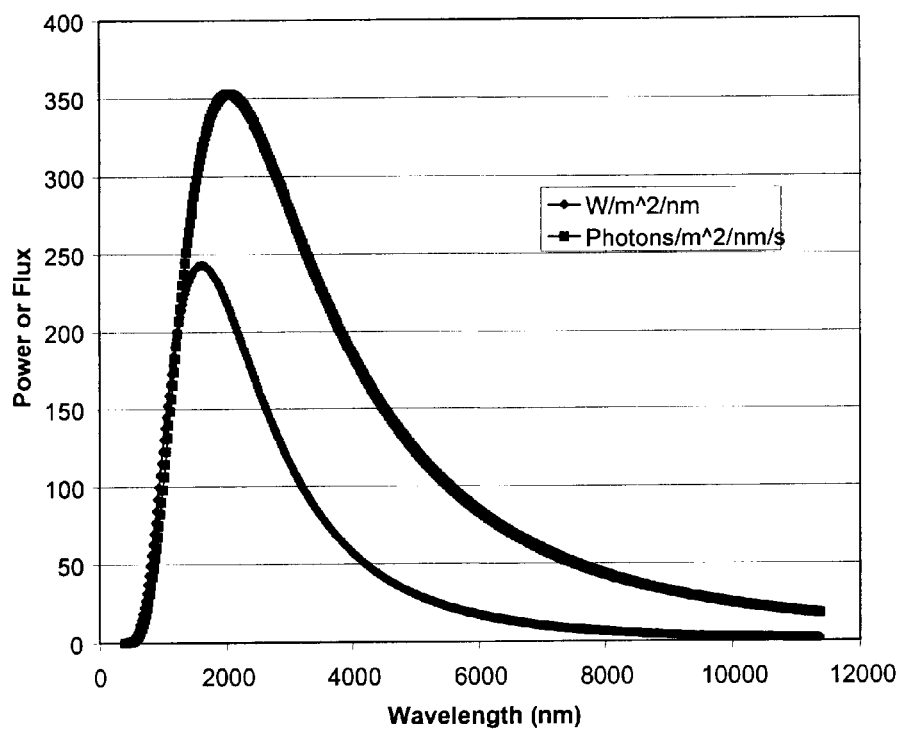
FIG. 1a shows the spectral characteristics of an ideal blackbody emitting at 1800° K.

$\varepsilon(\lambda)$ is the spectral emissivity given by the ratio of the radiative spectrum of the selective emitter source to an ideal blackbody source. The spectral radiant emittance of an ideal blackbody source is described by the equation $$M(\lambda, T) = \frac{c_1}{\lambda^5(\exp[c_2/\lambda T] - 1)} \text{ W/m}^3$$

where $c_1 = 2\pi hc^2 = 3.7415 * 10^{-16}$ W·m$^2$ $c_2 = hc/k = 1.4388 * 10^{-2}$ m·K = 14,388 $\mu$m·K In FIG. 1a is shown the power and radiant flux spectrum from an ideal blackbody radiation source emitting at 1800° K.

A typical TPV system might use a blackbody radiator at a temperature of 1800° K with a GaSb photovoltaic cell having an electronic bandgap of 0.72 eV ($\lambda_g \sim 1.7$ $\mu$m). The empirical model of Coutts (Coutts, page 105) was used to calculate the cell power output for the GaSb photovoltaic cell for this typical TPV system. The emitter output for a blackbody ($\varepsilon(\lambda)=1$) was calculated using the radiant flux spectrum shown in FIG. 1a. The calculated TPV efficiency for this typical TPV system with an 1800° K blackbody radiator is only about 12.6%. The TPV efficiency is low because much of the blackbody radiation is emitted at an energy that is less than the bandgap energy of the photovoltaic cell and, therefore, cannot be used for the photovoltaic generation of electricity.

The TPV efficiency can be improved by matching the radiation spectrum of the emitter to the spectral response of the photovoltaic cell. For the purpose of this disclosure, a selective emitter is a radiator that exhibits high emittance in the spectral range usable for the photovoltaic cell and has a low emittance elsewhere. Therefore, the TPV efficiency can be improved with a selective emitter that radiates relatively more power in the region where the photovoltaic cell responds. Preferably, the selective emitter should have a high emissivity for wavelengths less than the electronic bandgap wavelength $\lambda_g$ (i.e., at photon energies greater than the electronic bandgap energy), and a low emissivity for wavelengths greater than $\lambda_g$.

Figure 1B:
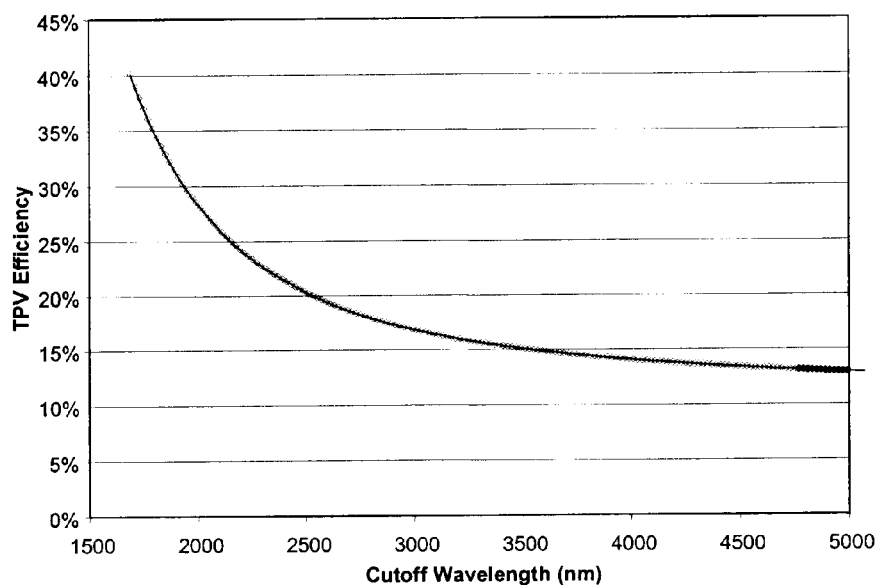
FIG. 1b shows the thermophotovoltaic efficiency with a GaSb photovoltaic cell and an ideal selective emitter having unity emissivity below a cutoff wavelength.

The ideal selective emitter would have an emissivity of unity in the peak response region of the photovoltaic cell, and an emissivity of zero in other regions of the spectrum. The improvement achievable with a selective emitter can be shown by estimating the efficiency of a TPV system comprising a GaSb photovoltaic cell and a selective emitter having stepped emissivity given by $\varepsilon(\lambda)=1, \lambda<\lambda_{cutoff}$ $\varepsilon(\lambda)=0, \lambda>\lambda_{cutoff}$ where $\lambda_{cutoff}$ is a cutoff wavelength below which the emissivity $\varepsilon(\lambda)$ is unity and above which no emission occurs. FIG. 1b shows the estimated TPV efficiency $\eta$TPV for such a stepped selective emitter. For emitter cutoff wavelengths $\lambda_{cutoff}$ much larger than photovoltaic cell bandgap wavelength $\lambda_g$ (about 1.7 $\mu$m for GaSb) the TPV efficiency approaches that of the blackbody radiator. At cutoff wavelengths comparable to the electronic bandgap wavelength, the emitter behaves as an ideal selective emitter with TPV efficiency approaching 40%.

Photonic Bandgap Selective Emitters

In general, photonic crystals comprise a dielectric emitter material having a large dielectric constant and at least one other lattice material having a smaller dielectric constant. Selective emission can be achieved in certain photonic crystals having the proper crystal symmetry, lattice constant, and dielectric contrast to provide a photonic bandgap. As demonstrated by Lin et al., thermal emission can be suppressed within the photonic bandgap and enhanced in the photonic band edge at energies greater than the photonic bandgap. Therefore, the TPV efficiency can be improved by matching the photonic band edge of the photonic crystal to the spectral response of the photovoltaic cell. In particular, the sharp emission band at the photonic band edge of the photonic crystal can be matched to the maximum absorption band above the absorption edge of the electronic bandgap of the photovoltaic cell.

Alternatively, the photonic crystal can have a cavity defect. The defect can be either additive (e.g., the addition of a high dielectric material where it would not normally occur in the photonic crystal structure) or subtractive (the removal of normally occurring dielectric material). Such defects are known to provide enhanced resonant emission within the photonic bandgap of the photonic crystal due to an increase in the allowed states in the density-of-states within the photonic bandgap. See e.g., Ozbay et al., "Defect structures in metallic photonic crystals," *Appl. Phys. Lett.* 69, 3797 (1996) and Lin et al., "Two- and Three-Dimensional Photonic Crystals Built with VLSI Tools," *MRS Bulletin*, pp. 627–631, August 2001, which are incorporated herein by reference. The emission wavelength and the cavity quality factor of the defect can be tailored by varying the geometry and index contrast of the periodic dielectric structure. Therefore, the enhanced emission from the cavity defect within the photonic bandgap of the photonic crystal can be matched to the spectral response of the photovoltaic cell to improve the TPV efficiency.

The emitter material is preferably both dispersive and absorptive, with a complex dielectric constant. A large dielectric contrast is required to obtain a full 3D photonic bandgap, preferred to obtain truly selective emissivity. Accordingly, for TPV applications, the real part $\epsilon_r(\omega)$ of the dielectric constant of the emitter material should preferably be much larger than the dielectric constant of the other dielectric material(s). Assuming that the other dielectric material is air, the absolute value of the real part $|\epsilon_r(\omega)|$ of the dielectric constant of the emitter material can be greater than 10 and preferably greater than 100. Furthermore, to obtain the strong absorption band providing the enhanced emission at the photonic band edge, the emitter material should preferably be somewhat lossy. Accordingly, the imaginary part $\epsilon_i(\omega)$ of the dielectric constant of the emitter material can be about 5 or greater.

Finally, the emitter material should be a relatively high temperature material to provide adequate radiant flux at energies matched to the photovoltaic cell. For blackbody emitters, high temperatures of about 1800° K have been required for practical TPV energy conversion systems. Lower temperatures, on the order of 500° K or higher, are sufficient with some photonic bandgap selective emitters, due to the more efficient TPV energy conversion resulting from the selective emission.

The combination of high $\epsilon_r(\omega)$, moderate $\epsilon_i(\omega)$, and a high temperature operation indicates metals as the emitter material. See e.g., I. El-Kady et al., "Metallic photonic crystals at optical wavelengths," *Phys. Rev. B* 62, 15299 (2000). In particular, refractory metals, such as tungsten, provide the large dielectric contrast and high temperature operation preferable for photonic crystal selective emitters for TPV energy conversion. At the GaSb absorption edge of 1.7 $\mu$m, the dielectric constant of tungsten has a real part $\epsilon_r(5888\ cm^{-1})=-33.4$ and an imaginary part $\epsilon_i(5888\ cm^{-1})=25.8$. In addition, tungsten can be easily deposited and patterned using commonly available tools in the microelectronics industry to achieve such a photonic bandgap selective emitter.

The present invention discloses a photonic crystal that selectively emits radiation at visible and near-infrared wavelengths useful for TPV energy conversion with low-bandgap photovoltaic cells. Various types of photonic crystal structures that exhibit a 2D or 3D photonic bandgap and are known to those in the art are suitable for the present invention. Some examples of photonic crystal structures and the fabrication thereof are disclosed in U.S. patent application Ser. No. 09/296,702 to Fleming and Lin, which is incorporated herein by reference.

Figure 2:
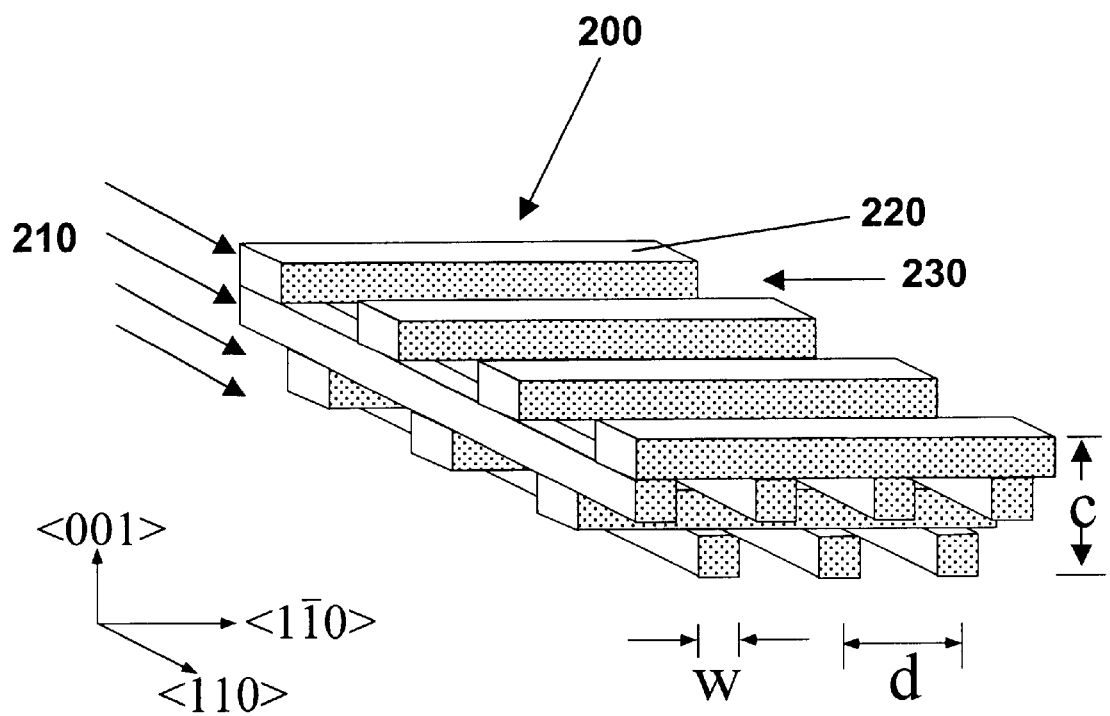
FIG. 2 shows a schematic illustration of a three-dimensional (3D) "Lincoln-Log" type photonic crystal structure.

A common type of photonic crystal exhibiting a 3D photonic bandgap that will be used as an illustrative example in the present disclosure is the Lincoln-Log type of photonic crystal structure 200 shown schematically in FIG. 2. The 3D Lincoln-Log type structure comprises alternating layers 210, each layer 210 further comprising an evenly spaced row of parallel "logs" or rods 220 of material with a first dielectric constant. The spaces between the rods 220 are filled by a material 230 having a second dielectric constant. For simplicity as well as for high dielectric contrast, material 230 is often air. For a four-layer photonic crystal 200, the one-dimensional rods 220 have a stacking sequence that repeats itself every four layers with a repeat distance of c. Within each layer 210, the axes of the rods 220 are parallel to each other with a pitch of d. Alternate layers 210 are rotated by 90 degrees relative to the previous layer. Between each layer 210, the rods 220 are shifted relative to each other by 0.5 d. The resulting structure has a face-centered-tetragonal lattice symmetry of which the diamond structure is a subset. For the special case of c/d=1.414, the crystal 200 can be derived from a face-centered-cubic unit cell with a basis of two rods.

Fabrication of a Lincoln-Log Tungsten Photonic Crystal

Photonic crystal structures exhibiting 3D photonic bandgaps suitable for the present invention can be fabricated by various methods known to those skilled in the art. For example, the fabrication of 3D metallic photonic crystals using self-assembly has recently been demonstrated. See e.g., Zakhidov et al., "Three-dimensionally periodic conductive nanostructures: network versus cermet topologies for metallic PBG," *Synthetic Metals* 116, 419 (2001). Using integrated circuit technologies, the vertical topology of the 3D photonic crystal structure can be built by repetitive deposition and etching of multiple dielectric films in a layer-by-layer method. One layer-by-layer method for fabricating the photonic crystal is to build up the structure directly with the structural material, as was done for the silicon photonic crystal of Lin et al., described above. Alternatively, the fabrication process can comprise forming a lattice structure mold for the structural material in a sacrificial material, selective deposition of the structural material into the lattice structure mold, and finally removing the sacrificial material from the backfilled mold to leave a photonic crystal of the structural material. The latter method may have advantages for structural materials that can otherwise build up large residual stresses during a direct layer-by-layer fabrication process. This fabrication process can be used to form photonic crystals of a wide variety of structural materials that can be deposited by a conformal process, including metals, metal alloys, and semiconductors.

For illustrative purposes, described below and illustrated in FIGS. 3a–3i is a layer-by-layer fabrication sequence for a 3D Lincoln-Log tungsten photonic crystal suitable for the TPV emitter of the present invention. The tungsten photonic crystal described herein has a pitch between adjacent rods of d=4.2 µm, a rod width of w=1.2 µm, and a layer thickness of 1.6 µm. Photonic crystals of other metals and refractory metals, such as aluminum, gold, and tungsten alloys, are also suitable for the TPV emitter of present invention.

The lattice structure mold can be formed by sequential deposition of a cavity-forming structural material, such as polysilicon, in alternating patterned layers of a sacrificial mold material, such as silica ($SiO_2$). The basic layer-by-layer polysilicon in silica fabrication sequence is described in Lin et al., *Nature* 394, 251 (1998) and U.S. Pat. No. 6,358,854 to Fleming and Lin, which are incorporated herein by reference. The layer-by-layer fabrication method disclosed by Fleming and Lin enables layered material composition with precise thickness, planarity, and alignment control.

Figure 3A:
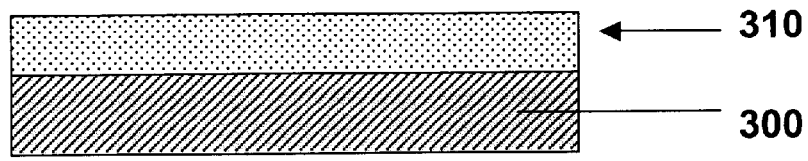
FIG. 3 illustrates a fabrication sequence for a four-layer Lincoln-Log type tungsten photonic crystal.

In FIG. 3a, a first layer 310 comprised of the sacrificial mold material, e.g., silica, is deposited onto a silicon substrate 300. The thickness of silica layer 310 is greater than the desired thickness of the first structured layer 340 of the photonic lattice, whose thickness is typically in the range 0.02–10 µm, depending on the photonic band edge wavelength of interest. For the 3D tungsten photonic crystal described herein, the thickness of the structured layer 340 can be 1.6 µm, and the initial thickness of silica layer 310 can be approximately 2.0 µm.

Figure 3B:
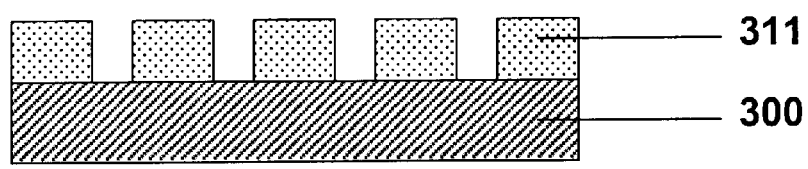

FIG. 3b shows the first silica layer 310 patterned to form a plurality of evenly spaced and parallel spacer bars 311 with approximately rectangular cross-section. Such patterning can be accomplished using a photolithographic etch mask (not shown) over silica layer 310 with a plurality of openings in the etch mask at the locations where the material in layer 310 between the spacer bars 311 is to be removed. An anisotropic etching process can then be used (e.g., reactive ion etching directed normal to the surface), resulting in bars 311 having approximately rectangular cross-section. The etching step is preferably performed to etch completely down through layer 310 to the substrate 300. The etch mask can then be stripped, resulting in the structure of FIG. 3b. In the present example, the pitch between adjacent spacer bars 311 can be 4.2 µm and the width of the spacer bars can be 3.0 µm.

Figure 3C:
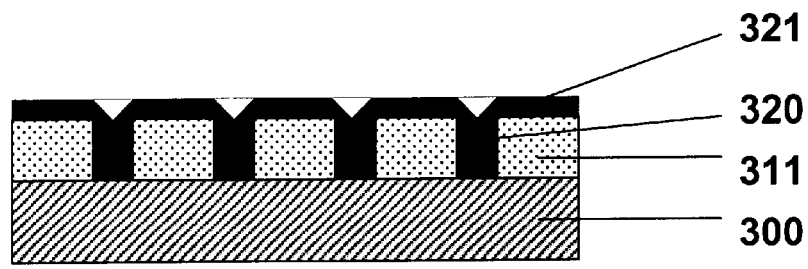

In FIG. 3c, polysilicon 320 can be deposited by chemical vapor deposition to fill in the regions between the silica spacer bars 311. Again, the polysilicon thickness can be greater than the desired final thickness of the first structured layer 340. Depositing the polysilicon 320 generally leads to a complex and non-planar surface 321. Such a rough and uneven surface could result in a poor quality photonic crystal, due to scattering and uncontrolled reflections at the growth surface. Therefore, chemical-mechanical-polishing (CMP) of the growth surface is performed to planarize the growth surface prior to deposition of subsequent structural layers. CMP of the general type used in the present invention is disclosed in U.S. Pat. No. 5,998,298 to Fleming et al., which is incorporated herein by reference.

Figure 3D:
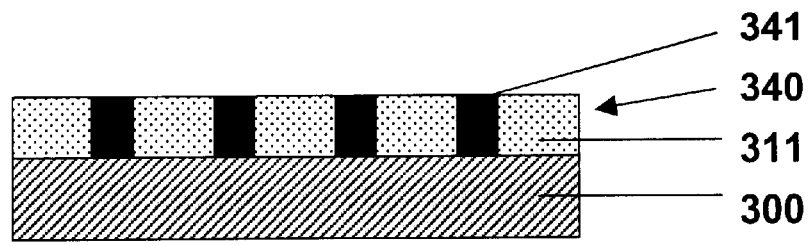

As shown in FIG. 3d, a first structured layer 340 comprising a planar pattern of silica spacer bars 311 and polysilicon rods 341 is thereby produced. The polysilicon rods 341 are elongate, roughly rectangular in cross section, and can be 1.2 µm wide and 1.6 µm thick.

Figure 3E:
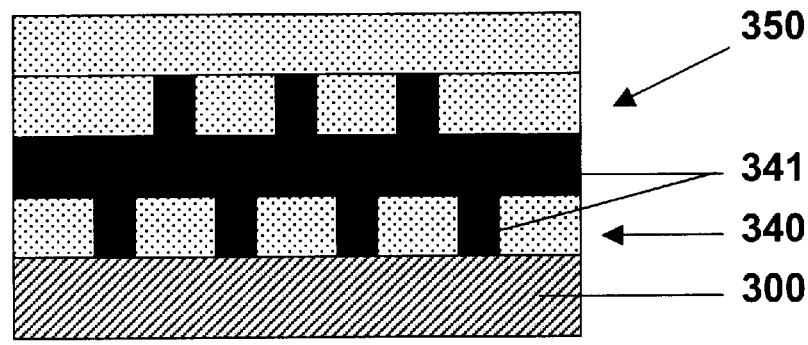

As shown in FIG. 3e, repeating the same basic set of growth and processing steps, multiple structured layers 340 can be grown on top of the substrate 300 to form the desired photonic lattice structure 350 with polysilicon. To form the Lincoln-Log structure, the orientation of the polysilicon rods 341 is rotated 90° between each structured layer 340, and between every other layer the rods 341 are shifted relative to each other by half of the pitch d. The structure 350 thereby has a face-centered-tetragonal lattice symmetry.

Figure 3F:
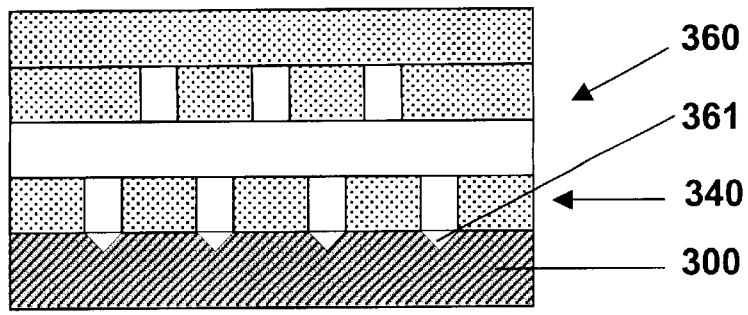

As shown in FIG. 3f, the polysilicon rods 341 can then be removed to form the lattice structure mold 360. The polysilicon rods 341 can be removed using a 6M, 85° C. KOH etch, which has a selectivity of ~100:1 (Si to $SiO_2$). Overetch during the KOH process, which is desirable to ensure the removal of all the polysilicon 341, can result in the formation of a "V" structure 361 on the bottom of the layer 340 contacting the silicon substrate 300. This is due to etching of the underlying silicon substrate 300 and is dependent on the substrate crystallographic orientation. The KOH etch effectively stops when the etch-front encounters the slow etching (111) planes of the silicon substrate 300, thereby forming the "V" groove 361.

Figure 3G:
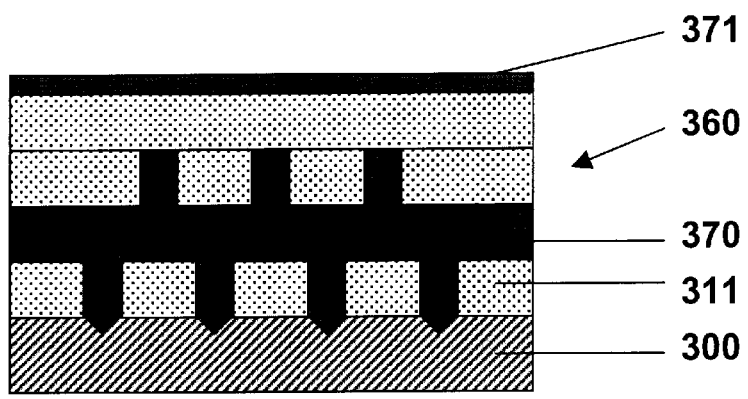

As shown in FIG. 3g, the lattice structure mold 360 can be backfilled with a structural material. A variety of deposition processes, such as chemical vapor deposition (CVD), electroplating, or infiltration with spin-on glasses or nanoparticles, can be used for the backfilling of the mold 360, so long as the sacrificial material (e.g., silica) can later be selectively removed from the backfilled structural material. For example, III–V compound semiconductors, II–VI materials, single and mixed oxides, nitrides, oxynitrides, metals, and metal alloys can be deposited by CVD. A precursor conducting coating can be applied to the lattice structure mold 360 and a wide variety of metals can be electroplated from a solution to backfill the mold 360. Typical electroplated metals include copper, nickel, gold, iron, silver, cobalt, and chromium.

The lattice structure mold 360 can be backfilled with tungsten via CVD to form tungsten rods 370 embedded in the silica mold material 311. A precursor 50 nm thick TiN adhesion layer (not shown) can be deposited on the mold 360 by reactive ion sputtering, since the blanket CVD tungsten film does not adhere to silicon dioxide. Tungsten can be deposited at high pressure (e.g., 90 Torr) from $WF_6$ and $H_2$. The chemical vapor deposition of tungsten results in films of very high purity. The tungsten film can have a resistivity of 10 µOhm-cm. Backfilling of the mold 360 with CVD tungsten 370 can result is a rough and uneven tungsten growth surface 371 on the top surface of the mold 360.

Figure 3H:
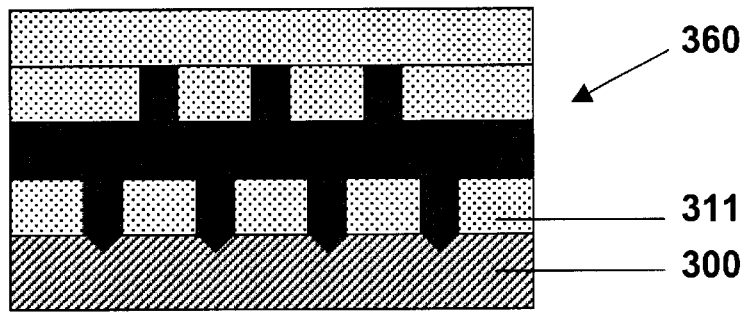
Figure 4A:
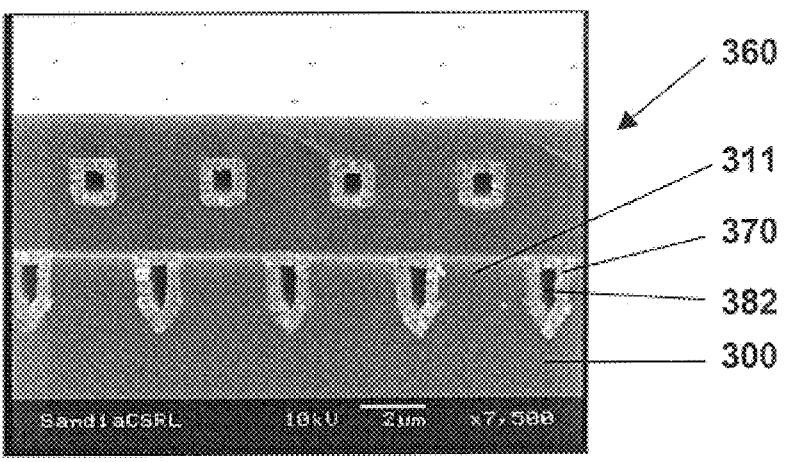
FIG. 4a shows the tungsten photonic crystal prior to removal of a silica sacrificial mold.

As shown in FIG. 3h the top surface of the backfilled mold 360 can planarized by CMP to remove the excess tungsten. A scanning electron micrograph of a tungsten-backfilled, planarized mold 360 is shown in FIG. 4a. As shown in FIG. 4a, a keyhole 382 can be formed in the center of the more deeply embedded lines of the tungsten rods 370, since the step coverage of the CVD tungsten deposition process is not 100%. However, the film thickness is far greater than the skin depth of tungsten for electromagnetic radiation in the visible and infrared.

Figure 3I:
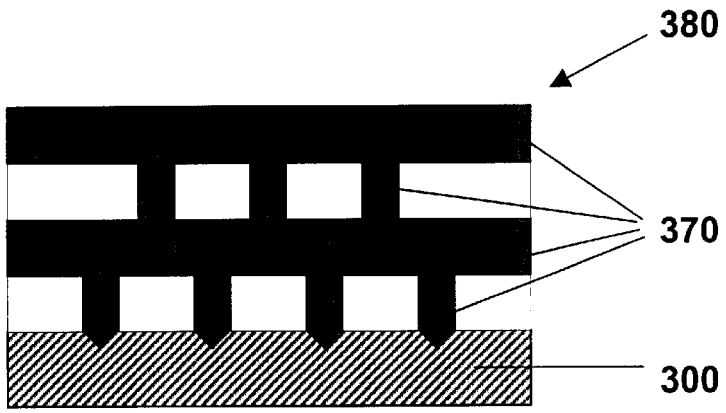
Figure 4B:
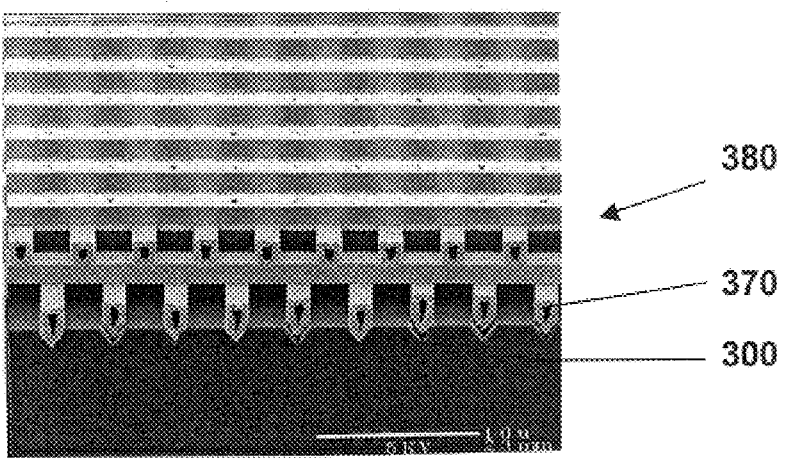
FIG. 4b shows the tungsten photonic crystal after removal of the silica sacrificial mold. The one-dimensional tungsten rod used to form the crystal has a rod width of 1.2 $\mu$m and the rod-to-rod spacing of 4.2 $\mu$m.

Finally, as shown in FIG. 3i, the silica spacer bars 311 can be removed from the tungsten-backfilled and planarized lattice structure mold 360 by selective etching with a 1:1 HF-based solution. The result is a 3D tungsten photonic crystal 380 comprising stacked tungsten rods 370 on the silicon substrate 300. FIG. 4b shows a scanning electron micrograph of the four-layer tungsten photonic crystal 380 comprising the stacked tungsten rods 370 on the silicon substrate 300. The tungsten photonic crystal 380 has a stacking sequence that repeats itself every four layers, and has a face-center-tetragonal lattice symmetry. In the exemplary tungsten photonic crystal described, the tungsten rod 370 width is 1.2 μm, rod-to-rod spacing is 4.2 μm and the filling fraction of the high index tungsten is 28%. The tungsten photonic crystal 380 retains sufficient structural integrity to be handled readily.

A cavity defect can be easily introduced into the 3D Lincoln-Log photonic crystal by modification of width or thickness of an individual rod or a layer of rods. For example, a subtractive defect can be introduced by removal of a rod in the crystal structure. Alternatively, and additive defect can be introduced by increasing the width of a rod. Finally, a cavity-like defect can be introduced by creating a separate, second bandgap by changing the height of a layer or layers of rods.

This fabrication process can be extended to create almost any interconnected photonic crystal having selective emissivity at visible or infrared wavelengths. For example, current state-of-the-art silicon integrated circuit processing tools are capable of shrinking the minimum feature sizes to those required for structures that have photonic bandgaps in the infrared and have selective emissivity in the near-infrared and visible. See, e.g., "International Technology Roadmap for Semiconductors," 1999 Edition [retrieved on Sep. 8, 2001]. Retrieved from the Internet:<URL: http://public.itrs.net/files/1999_SIA_Roadmap/Home.htm>

Optical Properties of the Tungsten Photonic Crystal

The optical properties of the 3D tungsten photonic crystal 380 fabricated according to the above process were characterized using a Fourier-transform infrared measurement system for wavelengths ranging from 1.5 to 25 μm. To obtain reflectance (R), a sample spectrum was taken from a 3D tungsten photonic crystal 380 first and then normalized to a reference spectrum of a uniform silver mirror. To find the absolute transmittance (T), a transmission spectrum taken from a tungsten photonic crystal 380 was normalized to that of a bare silicon wafer. This normalization procedure was to calibrate away extrinsic effects, such as light reflection at the air-silicon interface and absorption of the silicon substrate 300.

Figure 5:
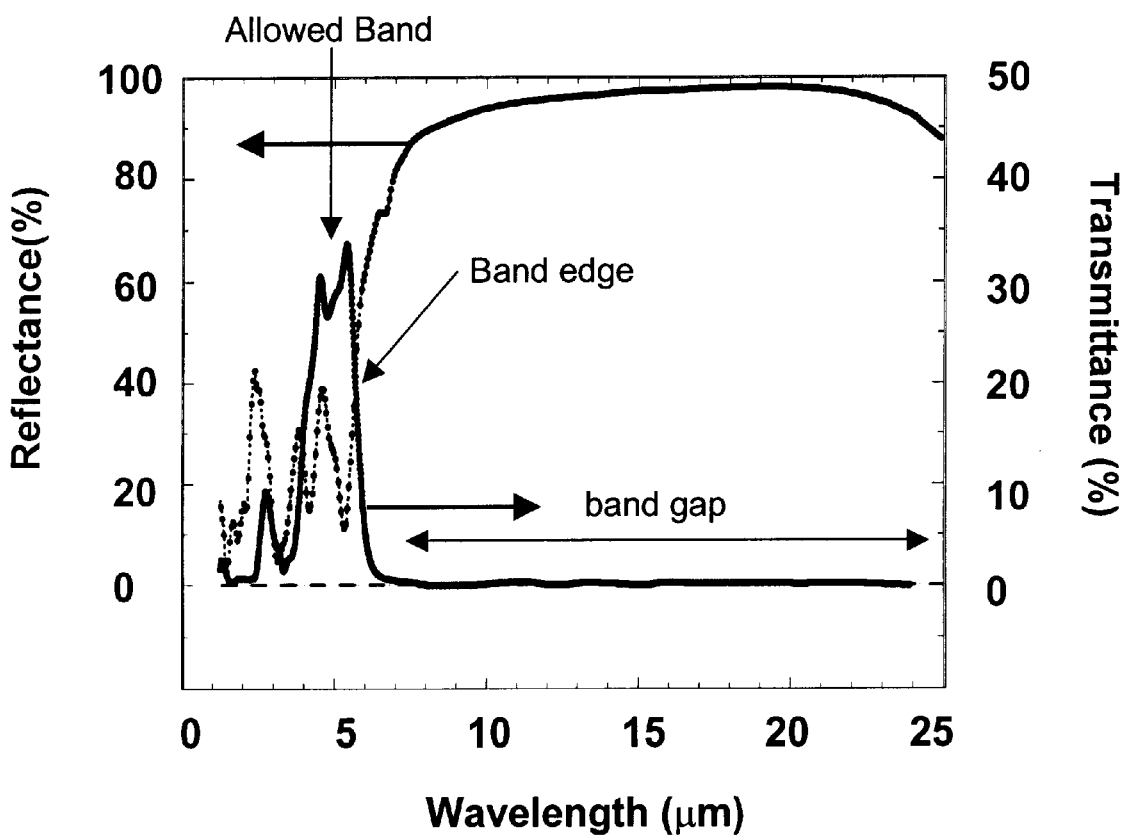
FIG. 5 shows the measured reflectance and transmittance spectra for the light propagating along the <001> axis of the four-layer tungsten photonic crystal.

In FIG. 5 is shown the absolute reflectance and transmittance spectra of a four-layer tungsten photonic crystal 380. The dashed baseline shows the transmittance of a 6000 Å uniform tungsten film for reference. Light propagates along the <001> direction of the tungsten photonic crystal 380 and is unpolarized. The reflectance spectrum exhibits oscillations at $\lambda<5.5$ μm, raises sharply at $\lambda\sim6$ μm (the band edge) and finally reaches a high reflectance of 90% for $\lambda>8$ μm. Correspondingly, the transmittance spectrum shows distinct peaks at $\lambda<5.5$ μm, decreases sharply at $\lambda\sim6$ μm (the band edge) and then vanishes to below 1% for $\lambda>8$ μm. The simultaneous high R and low T at wavelengths greater than 8 μm indicates the existence of a photonic bandgap in the tungsten photonic crystal. The attenuation is ~30 dB at $\lambda=10$ μm for the four-layer tungsten photonic crystal 380, or equivalently a 7.5 dB attenuation per layer. The multiple oscillations at $\lambda<5.5$ μm are attributed to photonic density-of-states oscillations in the photonic allowed band.

Figure 6:
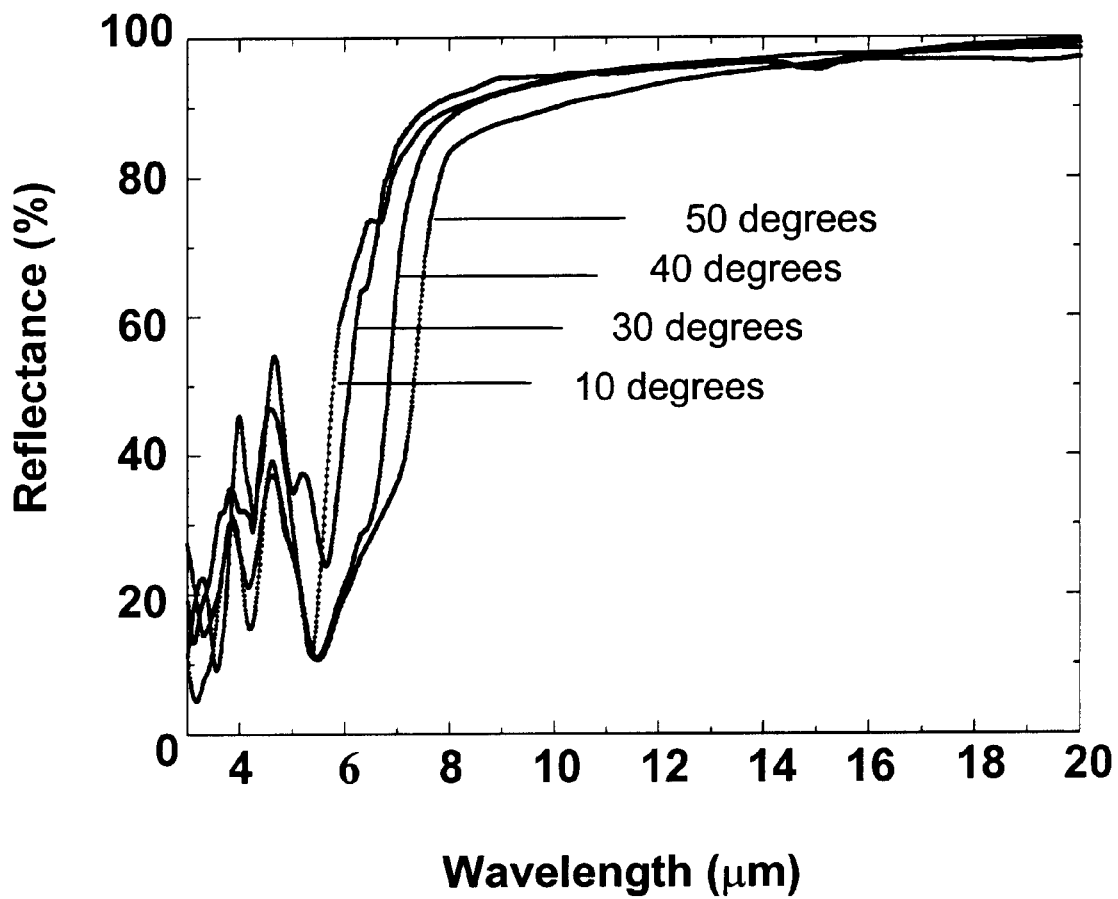
FIG. 6 shows the tilt-angle reflectance spectra from the four-layer tungsten photonic crystal.

As shown in FIG. 6, tilt-angle reflection spectra were taken to determine the angular dependence of the photonic bandgap. For tilt-angle transmission measurements, the tungsten photonic crystal 380 was mounted on a rotational stage and the rotational angles spanned from light incident angles from 0° to 60°, measured from the surface normal (i.e., the <001> direction). The crystal orientation is tilted from the <001> to <110> axes. The light incident angle is therefore systematically tilted away from G-X' toward G-L of the first Brillouin zone. Four tilt-angle spectra are shown in FIG. 6, for light incident angles of 10, 30, 40, and 50°, respectively. As the light incident angle is increased, the band edge position moves from $\lambda\sim6$ μm for q=10° to $\lambda\sim8$ μm for q=50°. Both the oscillating features at $\lambda<6$ μm and the high reflectance at longer wavelength remain for all light incident angles. Therefore, a large complete 3D photonic bandgap exists, from $\lambda\sim8$ μm to $\lambda>20$ μm, for the tungsten photonic crystal 380.

Figure 7:
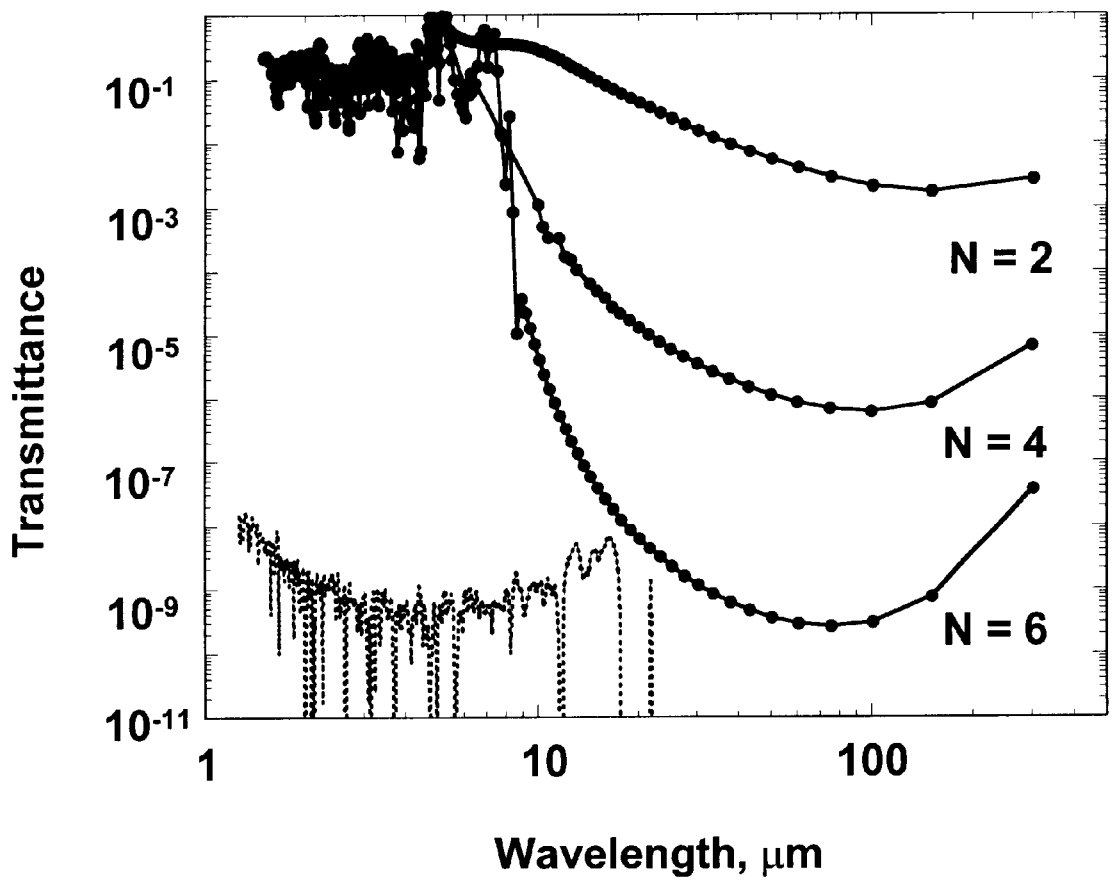
FIG. 7 shows the computed transmission spectra for tungsten photonic crystals with N=2, 4 and 6 layers.

In FIG. 7 is shown the theoretical transmission spectra for tungsten photonic crystals of different number-of-layers; N=2, 4, and 6, plotted in a log-to-log log scale. The dashed line is a reference spectrum for a uniform 6000 Å tungsten film. The theoretical transmission spectra were calculated according to the method of Sigalas et al. in *Phys. Rev. B*52, 11744 (1995). The transmittance is very low in the bandgap ($T<10^{-8}$ for N=6 layers), which is consistent with the small metallic skin-depth (300–500 Å for 1 μm$<\lambda<$25 μm), and is nearly independent of wavelength. The crystal spectrum, on the other hand, exhibits a much higher transmission ($T\sim10^{-1}$) in the allowed band, suggesting that photonic transport in the metallic allowed band is not dominated by metallic attenuation. Moreover, a strong dependence of transmittance on the number-of-layers of transmittance is observed in the bandgap ($\lambda>8$ μm). This number-of-layers-dependence indicates that transmittance attenuation at $\lambda>8$ μm scales with layer-thickness of the fabricated structure, but not the metallic skin depth. Hence, the observed low transmittance is due primarily to the photonic bandgap effect. The attenuation constant in the bandgap is extraordinarily large—about 8, 14 and 16 dB per layer at $\lambda=10$, 20 and 40 μm, respectively. This suggests that as few as four to six crystal layers are sufficient for achieving strong electromagnetic wave attenuation in the photonic bandgap.

Figure 8:
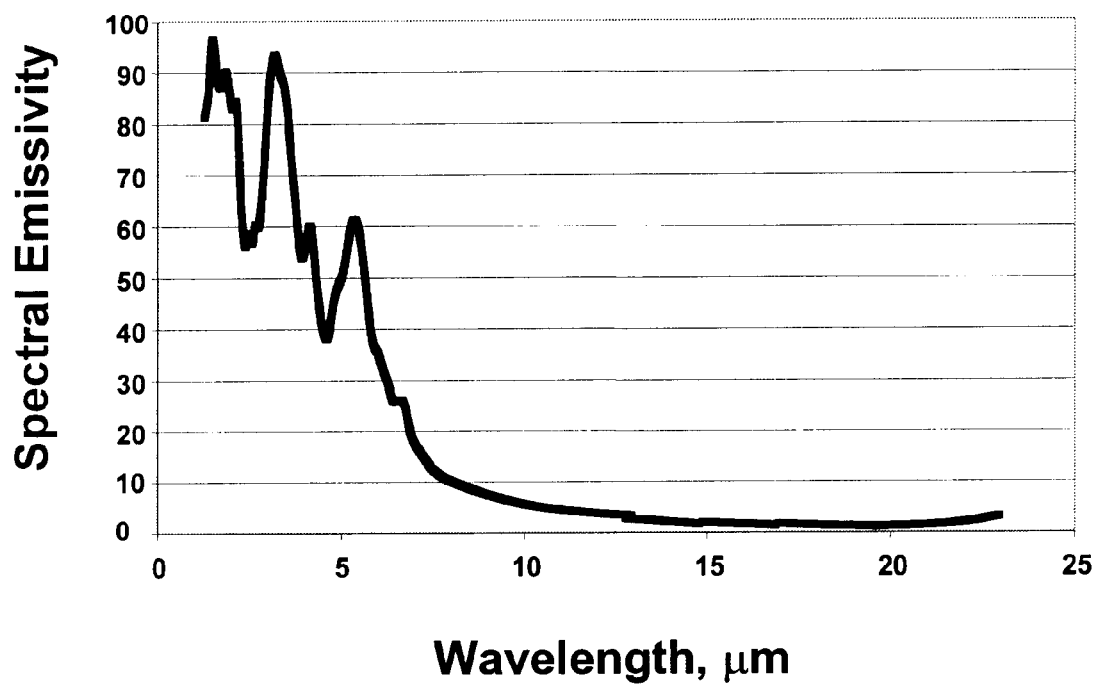
FIG. 8 shows the estimated spectral emissivity of the four-layer tungsten photonic crystal having a lattice constant of 4.2 $\mu$m.

Such an extraordinarily large bandgap is ideally suited for suppressing broadband Blackbody radiation in the far infrared and re-cycling radiant energy into the near infrared and visible spectrum. FIG. 8 shows the estimated spectral emissivity of the tungsten photonic crystal 380, derived from the absorptivity calculated from the reflectance and transmittance spectra. The crystal 380 has a photonic bandgap (region with nearly zero emissivity) over a large range in the far infrared (8 μm$<\lambda<$25 μm) portion of the spectrum. The very large photonic bandgap and large reduction in emissivity in the far infrared is due to the use of metal for the photonic crystal. In the photon recycling process, the photonic bandgap completely frustrates infrared thermal emission and selectively forces the radiation into near-infrared and visible emission. Consequently, the spectrum of the emitter can be controlled to selectively emit radiation below the edge of the photonic bandgap of the photonic crystal to match the peak response of the photovoltaic cell and provide efficient TPV energy conversion.

TPV Efficiency using the Tungsten Photonic Crystal

The tungsten photonic crystal 380 described above has a band edge wavelength of about 8 μm. The photonic band edge wavelength can be moved to shorter wavelengths by using a smaller lattice constant to match the spectral response of low-bandgap photovoltaic cells (e.g., having bandgap energies of less than 1 eV), such as GaSb, InGaAsP, or InGaAlSb. To estimate the TPV efficiency of a tungsten photonic crystal optimized to provide a good match to the peak spectral response of a GaSb photovoltaic cell, the estimated spectral emissivity of a tungsten photonic crystal with a band edge wavelength of 1.7 μm was obtained by dividing the wavelength scale of the estimated spectral emissivity of the tungsten photonic crystal shown in FIG. 8 by 3.4. This simple scaling procedure is valid because the dispersion relation in photonic crystals scales as the wavelength divided by the lattice constant. A band edge wavelength of 1.7 μm corresponds to a tungsten photonic crystal having a lattice constant of 1.2 μm. As discussed above, a photonic crystal having this smaller lattice constant can be readily fabricated using current state-of-the-art silicon integrated circuit processing tools.

The TPV efficiency was estimated for candidate selective emitters using a simple one-dimensional model of TPV energy conversion similar to the model described by M. Zenker et al., "Efficiency and Power Density Potential of Combustion-Driven Thermophotovoltaic Systems Using GaSb Photovoltaic Cells," *IEEE Trans. Elect. Dev.* 48, 367 (2001). Again, the TPV efficiency calculated with this model only calculates the radiation-to-electricity conversion efficiency and does not include fuel-to-radiation conversion efficiency. The model calculates the net radiant flux of the source by integrating the spectral emissivity of the selective emitter times the radiant flux for an 1800° K blackbody over all wavelengths. The electrical power output for the GaSb photovoltaic cell is the maximum current density times the cell voltage, assuming the cell is totally absorbing for radiation wavelengths at or below the bandgap wavelength. The TPV efficiency is electrical power output of the GaSb photovoltaic cell divided by the net radiant flux of the selective emitter.

Table 1 shows the results of the model calculations for an ideal blackbody, a tungsten photonic crystal having a band edge wavelength of 1.7 μm (modeled from the estimated spectral emissivity in FIG. 8), a microstructured tungsten emitter (modeled from the emissivity given by A. Heinzel, et al., "Microstructured Tungsten Surfaces as Selective Emitters," *Thermophotovoltaic Generation of Electricity: Fourth NREL Conference,* T. J. Coutts et al., ed., AIP, 1999), and an erbia/yttria selective emitter (modeled from the emissivity given by C. J. Crowley, et al., "Thermal Spray Approach for TPV Emitters," *Thermophotovoltaic Generation of Electricity: Fourth NREL Conference,* T. J. Coutts et al., ed., AIP, 1999). The tungsten photonic crystal can achieve a higher TPV efficiency than other candidate selective emitters for TPV energy conversion applications.

TABLE 1

| Emitter | Radiant flux (watts/cm$^2$) | Electric power (watts/cm$^2$) | Efficiency (%) |
|---|---|---|---|
| Blackbody | 56.9 | 7.2 | 12.6 |
| W photonic crystal | 14.2 | 3.8 | 26.9 |
| Microstructured W | 19.6 | 4.4 | 22.4 |
| Erbia/yttria | 16.6 | 2.6 | 15.5 |

The embodiments of the present invention have been described as a method for the thermophotovoltaic generation of electricity using a metallic photonic crystal. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for thermophotovoltaic generation of electricity, comprising:

heating a photonic crystal comprising a metal having a complex dielectric constant and at least one other lattice material having at least one other dielectric constant, whereby the photonic crystal selectively emits radiation at emission wavelengths less than an electronic bandgap wavelength of at least one photovoltaic cell; and collecting the radiation with the at least one photovoltaic cell, whereby the at least one photovoltaic cell converts the radiation to electricity.

2. The method of claim 1, wherein the emission wavelengths are at or below the photonic band edge of the photonic crystal.

3. The method of claim 1, wherein the emission wavelengths are within an emission bandwidth of a defect cavity of the photonic crystal.

4. The method of claim 1, wherein the at least one other lattice material comprises air.

5. The method of claim 1, wherein the metal comprises a refractory metal.

6. The method of claim 5, wherein the refractory metal comprises tungsten.

7. The method of claim 1, wherein the absolute value of the real part of the complex dielectric constant is greater than 10.

8. The method of claim 1, wherein the imaginary part of the complex dielectric constant is greater than 5.

9. The method of claim 1, wherein the photonic crystal has a characteristic lattice constant of less than 10 microns.

10. The method of claim 1, wherein the photonic crystal has a characteristic lattice constant of less than 5 microns.

11. The method of claim 1, wherein the photonic crystal has a two-dimensional photonic bandgap.

12. The method of claim 1, wherein the photonic crystal has a three-dimensional photonic bandgap.

13. The method of claim 1, wherein the photonic crystal has a Lincoln-Log structure.

14. The method of claim 1, wherein the photonic crystal is heated to a temperature of greater than 500° K.

15. The method of claim 1, wherein the photonic crystal is heated to a temperature of greater than 1000° K.

16. The method of claim 1, wherein the photonic crystal is heated to a temperature of greater than 1500° K.

17. The method of claim 1, wherein the at least one photovoltaic cell comprises a low-bandgap photovoltaic cell.

* * * * *